(12) United States Patent
Katsuta

(10) Patent No.: US 12,062,666 B2
(45) Date of Patent: *Aug. 13, 2024

(54) DISPLAY DEVICE WITH TOUCH DETECTION FUNCTION

(71) Applicant: Japan Display Inc., Tokyo (JP)

(72) Inventor: Tadayoshi Katsuta, Tokyo (JP)

(73) Assignee: Japan Display Inc., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 18/492,319

(22) Filed: Oct. 23, 2023

(65) Prior Publication Data

US 2024/0047475 A1 Feb. 8, 2024

Related U.S. Application Data

(63) Continuation of application No. 18/097,687, filed on Jan. 17, 2023, now Pat. No. 11,830,884.

(30) Foreign Application Priority Data

Jan. 27, 2022 (JP) ................................. 2022-011134

(51) Int. Cl.
| | |
|---|---|
| *H01L 27/12* | (2006.01) |
| *G06F 3/041* | (2006.01) |
| *G06F 3/044* | (2006.01) |
| *G09G 3/20* | (2006.01) |

(52) U.S. Cl.
CPC .......... *H01L 27/124* (2013.01); *G06F 3/0412* (2013.01); *G06F 3/04166* (2019.05); *G06F 3/044* (2013.01); *G09G 3/20* (2013.01); *G09G 2300/0408* (2013.01); *G09G 2300/0413* (2013.01); *G09G 2300/0426* (2013.01); *G09G 2310/0202* (2013.01); *G09G 2310/0297* (2013.01)

(58) Field of Classification Search
CPC .... G06F 3/0412; G06F 3/04166; G06F 3/044; G09G 3/20; G09G 2300/0408; G09G 2300/0413; G09G 2300/0426; G09G 2310/0202; G09G 2310/0297; H01L 27/124
See application file for complete search history.

(56) References Cited

U.S. PATENT DOCUMENTS

| | | | | |
|---|---|---|---|---|
| 2020/0192543 | A1* | 6/2020 | Wang | G06F 3/047 |
| 2020/0409201 | A1* | 12/2020 | Shiina | G02F 1/13439 |
| 2021/0341804 | A1* | 11/2021 | Kuroe | G02F 1/13338 |

(Continued)

*Primary Examiner* — Ryan A Lubit
(74) *Attorney, Agent, or Firm* — K&L Gates LLP

(57) ABSTRACT

A display device with touch detection function includes a display unit having a first and a second data lines, a first region outside the display unit, a second region on an opposite side of the first region sandwiching the display unit with the first region, a sensor unit including a sensor electrode, a first data signal supply line connected to the first data line and arranged in the first region, a second data signal supply line connected to the second data line and arranged in the second region, a dummy wiring arranged in the first region and not connected to the sensor electrode, and a sensor wiring arranged in the second region and connected to the sensor electrode. A line length of the dummy wiring in the first region is substantially same as a line length of the sensor wiring in the second region.

18 Claims, 11 Drawing Sheets

(56) References Cited

U.S. PATENT DOCUMENTS

| | | | | |
|---|---|---|---|---|
| 2021/0405818 | A1* | 12/2021 | Kim | H10K 59/40 |
| 2022/0107717 | A1* | 4/2022 | Lee | G06F 3/0445 |
| 2022/0147171 | A1* | 5/2022 | Huang | G06F 3/0446 |
| 2022/0171499 | A1* | 6/2022 | Han | G06F 3/04164 |
| 2022/0300113 | A1* | 9/2022 | Wang | G06F 3/0448 |

* cited by examiner

A signal supplied to a gate electrode 374 of a transistor 370 in a first multiplexer 107A and a signal supplied to a gate electrode 374 of a transistor 370 in a second multiplexer 107B A signal supplied to a data line 120

PRIOR ART

A signal supplied to a gate electrode 374 of a transistor 370 in a first multiplexer 107A and a signal supplied to a gate electrode 374 of a transistor 370 in a second multiplexer 107B A signal supplied to a data line 120

A signal supplied to a gate electrode 374 of a transistor 370 in a first multiplexer 107A and a signal supplied to a gate electrode 374 of a transistor 370 in a second multiplexer 107B A signal supplied to a data line 120

DISPLAY DEVICE WITH TOUCH DETECTION FUNCTION

CROSS-REFERENCE TO RELATED APPLICATIONS

This application is a continuation of U.S. patent application Ser. No. 18/097,687, filed Jan. 17, 2023, which claims the benefit of priority to Japanese Patent Application No. 2022-011134 filed on Jan. 27, 2022, the entire contents of which are incorporated herein by reference.

FIELD

An embodiment of the present invention relates to a display device with touch detection function.

BACKGROUND

In recent years, a display device (a display device with touch detection function) including a touch sensor is mounted on various electronic devices. The display device with touch detection function includes, for example, a plurality of pixels and sensor electrodes arranged in a screen (a display unit), a plurality of circuits provided in a peripheral region (a frame region) surrounding a display region and driving the plurality of pixels, a driver IC, a flexible board, and the like. The flexible board is electrically connected to, for example, a plurality of wirings routed to the peripheral area so as to connect the plurality of circuits to each other or the circuits and the driver IC. The display device with touch detection function can display an image on a screen, and can operate an input button, an icon, or the like displayed on the screen by using a sensor signal input to a sensor electrode by a target object to be detected (for example, a user's own finger, a touch pen, or the like).

SUMMARY

A display device with touch detection function according to an embodiment of the present invention includes a display unit in which a first data line and a second data line are arranged, a first region outside the display unit and a second region opposite to the first region, a sensor unit which overlaps on the display unit and includes a sensor electrode, a first data signal supply line which is electrically connected to the first data line and is arranged in the first data line, a second data signal supply line which is electrically connected to the second data line and is arranged in the second data line, a dummy wiring which is arranged in the first region and is not connected to the sensor electrode, and a sensor wiring which is connected to the sensor electrode, wherein the dummy wiring is overlapped with at least a portion of the first data signal supply line via an insulating layer, the a sensor wiring is overlapped with at least a portion of the second data signal supply line via the insulating layer, a line length in the first region of the a dummy wiring is substantially same as a line length in the second region of the sensor wiring.

DESCRIPTION OF EMBODIMENTS

Figure 1:
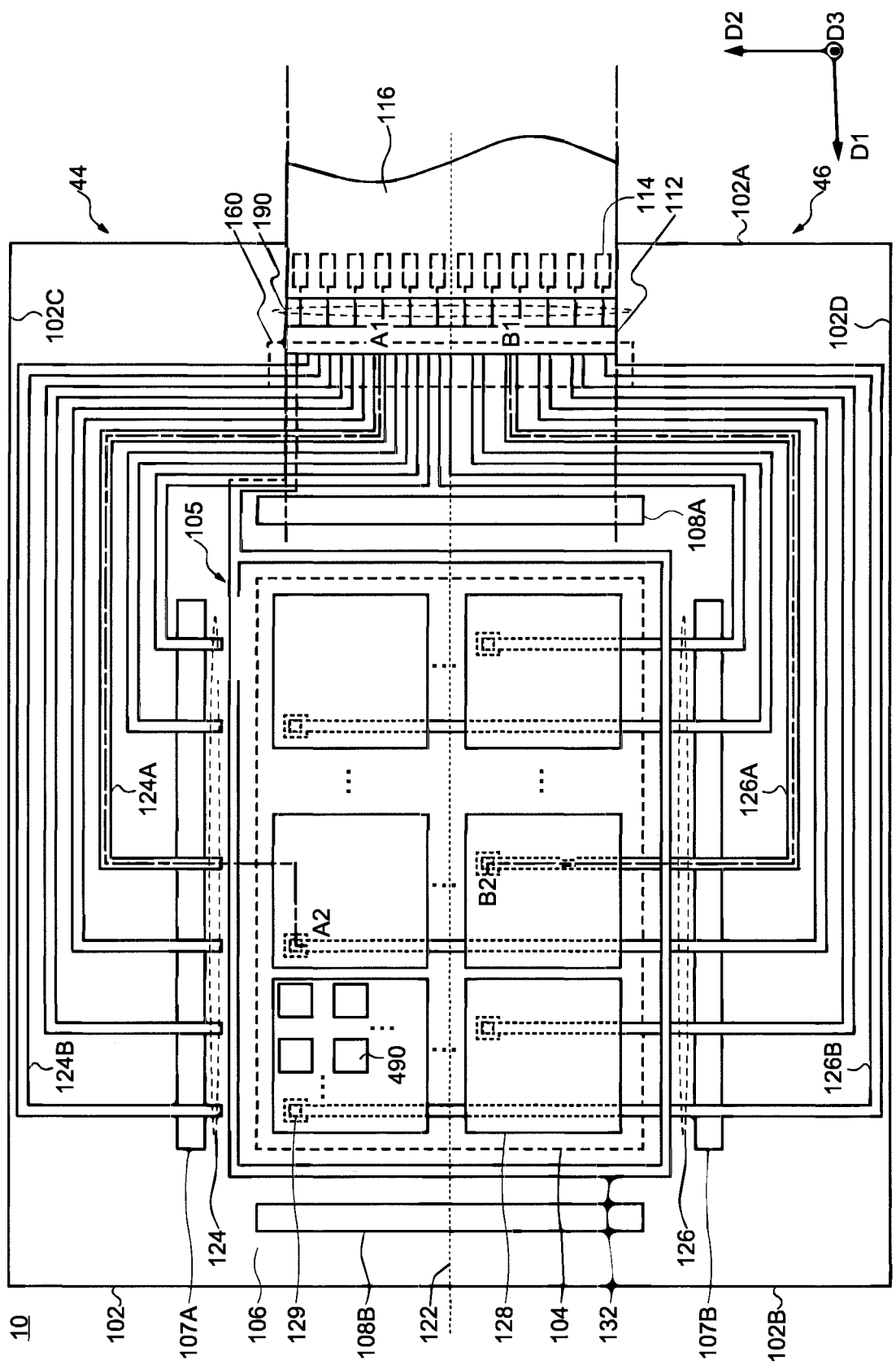
FIG. 1 is a plan view illustrating a configuration of a display device with touch detection function according to an embodiment of the present invention.

Hereinafter, each of embodiments of the present invention will be described with reference to drawings and the like. However, the present invention can be implemented in various embodiments without departing from a gist thereof, and is not to be construed as being limited to a description of the embodiments exemplified below. Further, in order to clarify the description with respect to the drawings, the width, the thickness, the shape, and the like of each part may be schematically represented in comparison with an actual embodiment, but schematic drawings are merely examples, and do not limit an interpretation of the present invention.

In the present invention, in case where a single film is processed to form a plurality of films, the plurality of films may have different functions and roles. However, the plurality of films are derived from films formed as same layer in same process, and have same layer structure and same material. Therefore, the plurality of films are defined as being present in the same layer.

In the embodiments of the present invention, expressions such as "up" and "down" in describing the drawings represent relative positional relationships between a structure of interest and other structures. In each of the embodiments of the present invention, in a side view, a direction from an insulating surface to a bank, which will be described later, is defined as "upper," and a reverse direction thereof is defined as "lower." In each embodiment of the present invention, in case of expressing a manner of arranging another structure on a certain structure, an expression "above" is simply intended to include both cases of arranging another structure directly above the certain structure so as to be in contact with the certain structure, and arranging another structure over the certain structure via another structure, unless otherwise specified.

Also, in the embodiments of the present disclosure, an expression "a includes A, B, or C", "a includes any of A, B and C", and "a includes one selected from a group consisting of A, B and C" do not exclude cases where a includes a plurality of combinations of A to C unless otherwise specified. Furthermore, these expressions do not exclude the case where a includes other elements.

Further, in each embodiment of the present invention, same reference numerals (or numerals having numbers followed by A, B, a, b, and the like) are given to elements similar to those described above with respect to the above-mentioned figures, and detailed description thereof may be omitted as appropriate. It should be noted that the letters "first" and "second" for each element are convenient labels used to distinguish each element, and do not have any further meaning unless otherwise described. In addition, in each embodiment of the present invention, the wirings denoted by same reference numerals may be a single wiring, or a plurality of wirings may be collectively shown.

Although a wiring group routed to the peripheral region is basically provided symmetrically or vertically symmetrically with respect to the screen in the display device with touch detection function as described above, but a specific wiring may be provided only on one side with respect to the screen in accordance with a request for narrowing a frame or multifunctional specific electrodes, so that a capacitance balance between the routing wiring between one and the other of the screen is lost, which may cause a defect in the display image.

An embodiment of the present invention discloses a display device with touch detection function in which a defect of an image displayed on a screen is suppressed in accordance with an arrangement of a plurality of wirings routed up and down or left and right with respect to the screen.

In some embodiments described below, a display device with touch detection function is exemplified in which a defect of an image displayed on a screen is suppressed in accordance with the arrangement of the plurality of wirings routed up and down or left and right with respect to the screen.

First Embodiment

In the present embodiment, an example in which a display device with touch detection function 10 is a so-called in-cell type touch panel type will be described. Note that the display device with touch detection function 10 includes, as described in the following embodiments, a case in which a state in which a detection target is in direct contact with the display device with touch detection function 10 is detected, and a case in which a state in which the detection target is brought close to the display device with touch detection function 10 is detected. That is, the display device with touch detection function 10 includes one or both of a function of inputting a command or information by touching the detection target object on the display device with touch detection function 10 and a function of inputting the command or the information by bringing the detection target object close to the display device with touch detection function 10. In the present embodiment, a state in which the display device with touch detection function 10 is viewed from a direction perpendicular to the insulating surface, the screen (a display unit 104), or a sensor electrode 128 is referred to as "plan view", and a state in which the display device with touch detection function 10 is cut along a plan or a curved surface intersecting the insulating surface and the cut surface is viewed from a direction parallel to the screen is referred to as "cross-sectional view". Further, in the present embodiment, for example, an axis (a long axis) parallel or substantially parallel to a third side 102C or a fourth side 102D is defined as a first axial D1, and an axis (a short axis) intersecting the first axial D1 and parallel or substantially parallel to a first side 102A or a second side 102B is defined as a second axial D2. Further, an axis intersecting the first axial D1 and the second axial D2 and perpendicular or substantially perpendicular to a plan including the first axial D1 and the second axial D2 (D1-D2 plan) is defined as a third axial D3.

<1-1. Configuration of Display Device with Touch Detection Function 10>

Figure 2:
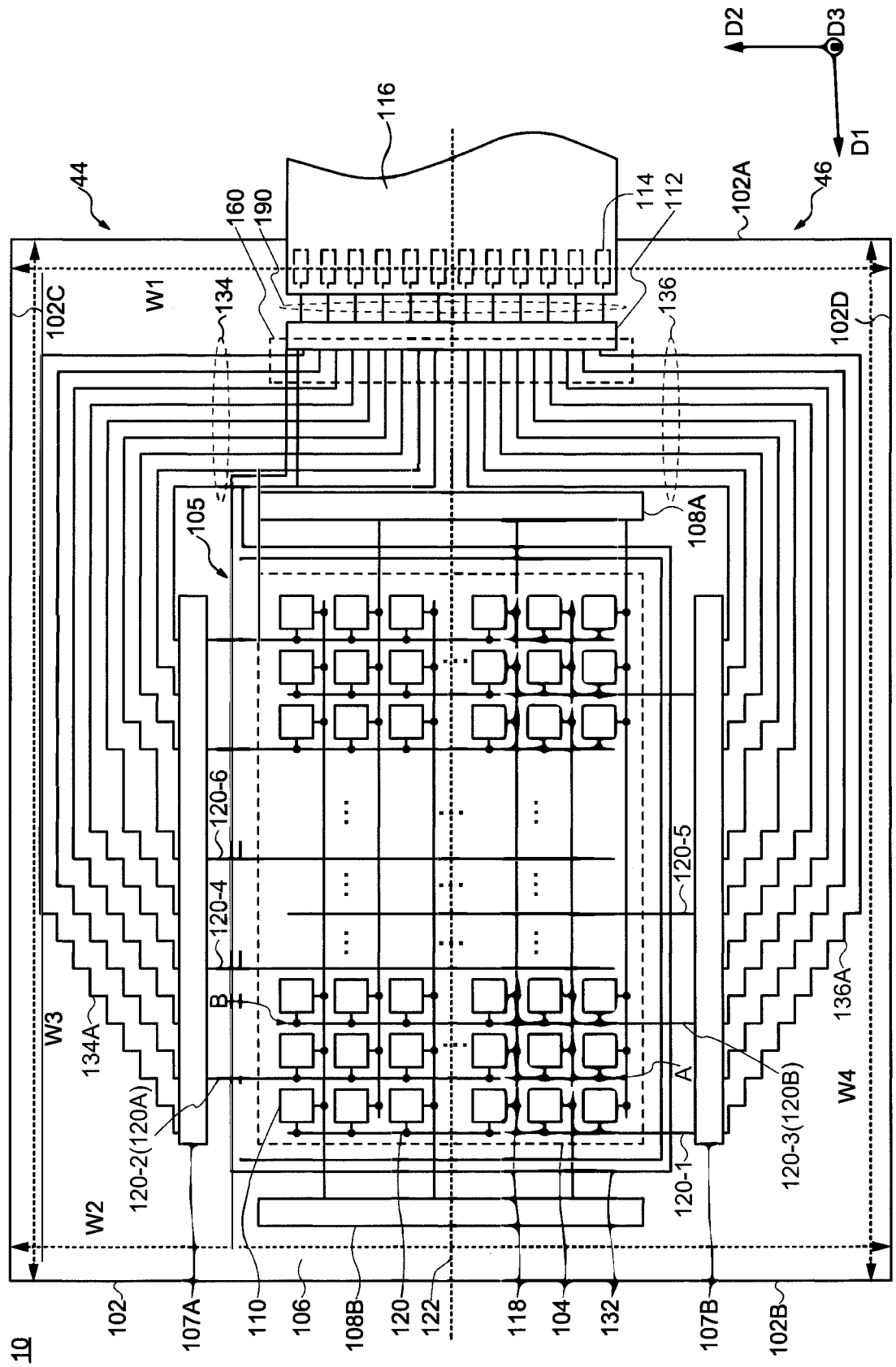
FIG. 2 is a plan view illustrating a configuration of a display device with touch detection function according to an embodiment of the present invention.

FIG. 1 and FIG. 2 are plan views illustrating a configuration of the display device with touch detection function 10. The configuration of the display device with touch detection function 10 is not limited to the configuration illustrated in FIG. 1 and FIG. 2.

As illustrated in FIG. 1 or FIG. 2, the display device with touch detection function 10 which includes, for example, the display unit 104, a sensor unit 105 including a plurality of sensor electrodes 128, a peripheral unit 106, a first multiplexer 107A and a second multiplexer 107B, a first scanning line driving circuit 108A and a second scanning line driving circuit 108B, a driver IC 112, a terminal unit in which a plurality of terminals 114 are arranged, and a flexible printed circuit board 116, are formed on the insulating surface.

The insulating surface is a surface of a first substrate 102 in the present embodiment. The first substrate 102 supports each layer constituting a transistor, a liquid crystal element, or the like provided on a surface of the first substrate 102. The first substrate 102 itself may be made of an insulating material, the surface of the first substrate 102 itself may be an insulating surface, and a surface of an insulating film separately formed on the first substrate 102 may be an insulating surface. The material of the first substrate 102 and the material for forming the insulating film are not particularly limited as long as the insulating surface can be obtained.

The first substrate 102 has the first side 102A, the second side 102B, the third side 102C, and the fourth side 102D. The first substrate 102 includes a first region 44 outside the display unit 104 and a second region 46 adjacent to the first region 44 and opposite to the first region 44 across the display unit 104. The first side 102A and the second side 102B face each other and are parallel or substantially parallel to the second axial D2. The third side 102C and the fourth side 102D face each other and are parallel or substantially parallel to the first axial D1. A length of the first side 102A is a length W1, a length of the second side 102B is a length W2, and the length W1 is same as or substantially same as the length W2. A length of the third side 102C is a length W3, a length of the fourth side 102D is a length W4, and the length W3 is same as or substantially same as the length W4. The length W1 and the length W2 are shorter than the length W3 and the length W4. The first side 102A and the second side 102B may be referred to as the short axis, and the third side 102C and the fourth side 102D may be referred to as the long axis.

The display unit 104, the sensor unit 105, the peripheral unit 106, the driver IC 112, the terminal unit in which the plurality of terminals 114 are arranged, the flexible printed circuit board 116, the first scanning line driving circuit 108A, and the second scanning line driving circuit 108B are arranged over both regions of the first region 44 and the second region 46. The first multiplexer 107A, a dummy wiring 124, and a first data signal supply line 134 are disposed in the first region 44, and the second multiplexer 107B, a second data signal supply line 136, and a sensor wiring 126 are disposed in the second region 46. A portion of the second data signal supply line 136 may be disposed in the first region 44. A line length in the first region 44 of at least one dummy wiring 124 among a plurality of dummy wirings 124 is same as or substantially same as a line length in the second region 46 of at least one sensor wiring 126 among the plurality of sensor wirings 126. The peripheral unit 106 surrounds the display unit 104 and the plurality of sensor electrodes 128. The peripheral unit 106 includes the first region 44 and the second region 46.

The flexible printed circuit board 116 is electrically connected to a terminal unit in which the plurality of terminals 114 provided in the peripheral unit 106 are arranged. The flexible printed circuit board 116 supplies a signal from an external circuit (not shown) to each circuit on the peripheral unit. One end portion of the flexible printed circuit board 116 is located between the first side 102A and the driver IC 112 in the present embodiment. The flexible printed circuit board 116 is connected to the vicinity of the short axis of the first substrate 102, and a signal from the flexible printed circuit board 116 is input from the short axis side and supplied to the display unit 104 and the plurality of sensor electrodes 128 in the present embodiment.

The display unit 104 is provided with a plurality of scanning lines extending in a first direction and a plurality of data lines extending in a second direction, and a region partitioned by the scanning lines and the data lines is a pixel region. A plurality of pixels 110 in the pixel area are arranged in a matrix parallel to or substantially parallel to the first axial D1 and the second axial D2. Each of the plurality of pixels 110 includes a pixel circuit (not shown), a pixel electrode 490, and the liquid crystal element (not shown).

Each of the plurality of pixels 110 may correspond to, for example, a sub-pixel R displaying red, a sub-pixel G displaying green, and a sub-pixel B displaying blue. One pixel unit may be formed by these three sub-pixels. The pixel unit may include not only these three sub-pixels but also other colors such as W (white) and Y (yellow), or may include any two sub-pixels. Each of the sub-pixel R, the sub-pixel G, and the sub-pixel B may be provided with a color filter layer that emits three primary colors of red, green, and blue.

The pixel circuit includes, for example, a transistor as a pixel switch, a capacitive element, and the like. The transistor includes a gate electrode, a source electrode, and a drain electrode. The gate electrode is electrically connected to a scanning line 118. The source electrode is electrically connected to a data line 120. The drain electrode is electrically connected to the pixel electrode 490. The liquid crystal element and the capacitive element are electrically connected between the pixel electrode 490 and a common electrode. The sensor electrode 128 also serves as the common electrode in the present embodiment. The pixel 110 according to the present embodiment is applicable to FFS (Fringe Field Switching) mode or IPS (In Plane Switching) mode. An electric field (for example, an electric field parallel or substantially parallel to an upper surface of the first substrate 102 of a fringe electric field) in the pixel 110 is formed between the sensor electrode 128 as the common electrode and the pixel electrode 490. An alignment of the liquid crystal elements included in a liquid crystal layer 178 (FIG. 7 and FIG. 8) is controlled mainly by using the electric field, in the display device with touch detection function 10 according to the present embodiment.

The driver IC 112 is disposed on the first board 102 in a COG(Chip on Glass) manner, but an arrangement of the driver IC 112 is not limited to the example shown here. The driver IC 112 may be disposed on the flexible printed circuit board 116 in a COF(Chip on Film) manner.

The driver IC 112 is electrically connected to the plurality of terminals 114 using a plurality of wirings 190 disposed between the driver IC 112 and the plurality of terminals 114. In addition, the driver IC 112 is electrically connected to a plurality of terminals 264 provided in the peripheral unit 106 (including 264A, 264B, see FIG. 5 and FIG. 6). The driver IC 112 includes a data line driving circuit and a touch sensor driving circuit. The driver IC 112 outputs respective signals generated in the driver IC to the respective terminals 264, and functions as a control unit that controls the first scanning line driving circuit 108A, the second scanning line driving circuit 108B, the first multiplexer 107A, the second multiplexer 107B, the plurality of sensor electrodes 128, and the dummy wirings 124. For example, the driver 10112 includes a circuit including a function of the data line driving circuit (not shown) other than the sampling switch, and the first multiplexer 107A and the second multiplexer 107B include a transistor 370 (sampling switch (FIG. 7 and FIG. 8)). The data line driving circuit supplies a control signal and a data signal to the first multiplexer 107A and the second multiplexer 107B. The function as the control unit of the driver 10112 will be described later.

A part of the driver IC 112, the first scanning line driving circuit 108A, the second scanning line driving circuit 108B, the first multiplexer 107A, and the second multiplexer 107B may be referred to as a control circuit in the present embodiment, and the driver IC 112, the first scanning line driving circuit 108A, the second scanning line driving circuit 108B, the first multiplexer 107A, and the second multiplexer 107B may be collectively referred to as the control circuit in the present embodiment.

The first multiplexer 107A is electrically connected to the drivers 10112 via a plurality of first data signal supply lines 134 provided in the first area 44 (FIG. 2). The first multiplexer 107A is also electrically connected to an even-numbered plurality of data lines 120 (data lines 120-2, 120-4, 120-6, . . . ) counted from a side farther from the driver IC 112 (a side closer to the second side 102B) among the plurality of data lines 120 provided in the display unit 104. The first multiplexer 107A includes a plurality of sampling switches, and each of the plurality of sampling switches electrically connects a corresponding one of the first data signal supply lines 134 and a corresponding one of the even-numbered data lines 120 (for example, the first data line). As shown in FIG. 2, the plurality of data lines 120 electrically connected to the first multiplexer 107A include a data line 120A.

The second multiplexer 107B is electrically connected to the drivers IC 112 via a plurality of second data signal supply lines 136 supply in the second area 46 (FIG. 2). The second multiplexer 107B is also electrically connected to the plurality of odd-numbered data lines 120 (data lines 120-1, 120-3, 120-5, . . . ) counted from the side farther from the driver IC 112 among the plurality of data lines 120 provided in the display unit 104. The second multiplexer 107B includes the plurality of sampling switches, and each of the plurality of sampling switches electrically connects a corresponding one of the second data signal supply lines 136 and a corresponding one of the odd-numbered data lines 120 (for example, the second data line). As shown in FIG. 2, the plurality of data lines 120 electrically connected to the second multiplexer 107B includes a data line 120B.

The first data signal supply line 134 is routed along the first side 102A and the third side 102C. Further, the first data signal supply line 134 extends from the third side 102C toward the fourth side 102D (in the second axial D2 direction) and is electrically connected to the first multiplexer 107A. The first multiplexer 107A is driven, so that the first data signal supply line 134 is electrically connected to the corresponding even-numbered data line 120. The second data signal supply line 136 is routed along the first side 102A and the fourth side 102D. Further, a part of the second data signal supply line 136 extends from the fourth side 102D toward the third side 102C (in the second axial D2 direction) and is electrically connected to the second multiplexer 107B. The second multiplexer 107B is driven, so that the second data signal supply line 136 is electrically connected to the corresponding odd-numbered data line 120. The even-numbered data line 120 and the odd-numbered data line 120 are arranged in the display unit 104 including the plurality of pixels 110.

Here, a wiring path and a line length in the display device with touch detection function 10 will be described. The wiring path in the display device with touch detection function 10 indicates, for example, a path of the wiring (data signal supply lines 134 and 136) from the driver IC 112 (terminal 264 (FIG. 5)) to the multiplexer 107A, 107B, and the line length indicates a length of the wiring path. A center line 122 connecting the midpoints of the first side 102A and the second side 102B, in plan view of the display device with touch detection function 10, is used as an axis of symmetry, and in case where the wiring paths of the first region 44 and the wiring paths of the second region 46 coincide with each other, the wiring path of the first region 44 is symmetrical with the wiring path of the second region 46, and the line length of the wiring path of the first region 44 is same as the line length of the wiring path of the second region 46.

More specifically, a wiring path of a first data signal supply line 134A routed outermost in the first region 44 is symmetrical to a wiring path of a second data signal supply line 136A routed outermost in the second region 46, and the line length of the first data signal supply line 134A is same as the line length of the second data signal supply line 136A. Similarly, a wiring path of the first data signal supply line 134 provided on one inner side of the first data signal supply line 134A in the first region 44 is symmetrical to a wiring path of the second data signal supply line 136 provided on one inner side of the second data signal supply line 136A in the second region 46 and has the same line length. The same applies to the relationships between the data signal supply lines 134 and 136 provided on the inner side. Incidentally, the base end portion and the distal end portion of these data signal supply lines 134 and 136, the relationship with other wiring or circuit layout, or the relationship with the configuration for alternately extending the data line 120 from the upper and lower multiplexer 107A, 107B as described above may be provided with a slight detour from an original arrangement position, although symmetrical in most of the wiring path by this, some symmetry at the end portion may collapse, in this embodiment is also symmetrical. More specifically, the two parallel two-dot chain lines shown in FIG. 1 are located on the same straight line as the two short sides of the longitudinal ends of the drivers IC 112. So-called the end portions of the data signal supply wirings (134, 136) are gathered in the region between the two-dot chain lines, and there is a possibility that the symmetry of the data signal supply wirings in the region is slightly broken due to the connection between the end portions and the driver IC 112 (see FIG. 5). In the present embodiment, a fact that the pair of data signal supply wirings 134 and 136 corresponding to each other are symmetrical with respect to the center line 122 includes a fact that an arrangement is symmetrical at least in a region other than the region between the double-dotted line wirings. Alternatively, in the present embodiment, a fact that the line lengths of the pair of data signal supply wirings 134 and 136 corresponding to each other are the same includes a fact that the line lengths are the same at least in a region other than the region between the double-dotted line wirings.

The first scanning line driver 108A is disposed, for example, between the display unit 104 and the first side 102A, electrically connected to the drivers IC 112, and electrically connected to even-numbered scanning lines 118 counted from the side closer to the third side 102C. The second scanning line driving circuit 108B is disposed between the display unit 104 and the second side 102B, is electrically connected to the drivers IC 112, and is electrically connected to a plurality of odd-numbered scanning lines 118 counted from the side closer to the third side 102C. A plurality of scanning lines 118 electrically connected to the first scanning line driving circuit 108A and a plurality of scanning lines 118 electrically connected to the second scanning line driving circuit 108B extend in parallel or substantially parallel to the first axial D1 and are alternately arranged with each other. Note that, an arrangement of the first scanning line driving circuit 108A may be replaced with an arrangement of the second scanning line driving circuit 108B. The first scanning line driver circuit 108A and the second scanning line driver circuit 108 may be electrically connected to all of the scanning lines 118.

Note that, in order to make the display device with the touch detection function 10 easier to see, in FIG. 1, the display unit 104 overlapping on the sensor unit 105 including the plurality of sensor electrodes 128, the first data signal supply line 134 overlapping on the dummy wiring 124, the second data signal supply line 136 overlapping on the sensor wiring 126, and the like are omitted, and in FIG. 2, the plurality of sensor electrodes 128 overlapping on the display unit 104, the dummy wiring 124 overlapping on the first data signal supply line 134, the sensor wiring 126 overlapping on the second data signal supply line 136, and the like are omitted.

The plurality of sensor electrodes 128 are arranged in a matrix parallel or substantially parallel to the first axial D1 and the second axial D2. The plurality of sensor electrodes 128 overlaps on the display unit 104, and one sensor electrode 128 is overlapped on the plurality of pixels 110 (that is, the pixel electrodes 490). For convenience of explanation, in FIG. 1, the upper left sensor electrode 128 is overlapped a plurality of pixel electrodes 490, and the plurality of pixel electrodes 490 overlaps the other sensor electrodes 128 are omitted. In practice, one sensor electrode 128 is overlapped 100 or more pixel electrodes 490, but for convenience of explanation, the size of the pixel electrode 490 is exaggerated in FIG. 1.

The drivers IC 112 are electrically connected to a plurality of sensor wirings 126. The plurality of sensor wirings 126 are routed along the first side 102A and the fourth side 102D in the second area 46 and extend from the fourth side 102D toward the third side 102C (in the second axial D2 direction). The plurality of sensor wirings 126 overlaps on the plurality of second data signal supply lines 136 and the second multiplexer 107B by being routed in this manner. Further, the plurality of sensor wirings 126 extend into the display unit 104 and overlaps the plurality of sensor electrodes 128, and are electrically connected to one sensor electrode 128 via a contact hole 129.

The driver IC 112 is electrically connected to a plurality of dummy wirings 124. The plurality of dummy wirings 124 are routed along the first side 102A and the third side 102C in the first area 44 and extend from the third side 102C toward the fourth side 102D (in the second axial D2 direction). The plurality of dummy wirings 124 overlaps on the plurality of first data signal supply lines 134 and the first multiplexer 107A by being routed in this manner. The plurality of dummy wirings 124 does not extend to the display unit 104, and do not overlap on or do not connect to the plurality of sensor electrodes 128.

For example, a part of the plurality of sensor wirings 126 and a part of the plurality of dummy wirings 124 are arranged symmetrically or substantially symmetrically with respect to the center line 122 in a plan view of the display device with touch detection function 10. More specifically, as shown in FIG. 1, a wiring path of a sensor wiring 126A among the plurality of sensor wirings 126 arranged in the second region 46 is symmetrical to a wiring path of a dummy wiring 124A among the plurality of dummy wirings 124 arranged in the first region 44, and a line length of the sensor wiring 126A in the peripheral unit 106 is same as a line length of the dummy wiring 124A.

More specifically, for example, as shown in FIG. 1, a wiring path of a sensor wiring 126B that is routed to the outermost side in the second region 46 is substantially symmetrical with a wiring path of a dummy wiring 124B that is routed to the outermost side in the first region 44, and a line length of the sensor wiring 126B is same as a line length of the dummy wiring 124B. Note that, similarly to the data signal supply lines 134 and 136, base end portions of the sensor wiring 126 and the dummy wiring 124 may be provided deviated from an original symmetrical arrangement from a relation with an output terminal or other wiring of the driver IC 112, and thus is symmetrical in most of the wiring path, but there is a case where the symmetry is broken slightly (described later) at the base end portion (a terminal peripheral wiring area 160 to be described later), but in this embodiment, the plurality of sensor wirings 126 and the plurality of dummy wirings 124 are arranged symmetrically also in such a case.

In addition, the driver IC 112 is electrically connected to a guard electrode 132 that surrounds the display unit 104 and the plurality of sensor electrodes 128. The guard electrode 132 is supplied with a constant voltage via the driver IC 112, and has a role to protect the display unit 104 and the plurality of sensor electrodes 128. The constant voltage is, for example, a voltage VH (FIG. 3A, FIG. 3B, FIG. 4A and FIG. 4B), a voltage VL (FIG. 3A, FIG. 3B, FIG. 4A and FIG. 4B), a common voltage, and the like. The common voltage may be a constant potential or a pulse wave (AC square wave) having a predetermined period, and a fixed potential having a predetermined potential may also be adopted. In case where the sensor signal is a pulse wave, it is desirable that the phase of the signal supplied to the dummy wiring 124 and the phase of the sensor signal supplied to the sensor wiring 126 are aligned. The constant voltage is preferably aligned with a phase of a sensor signal supplied to the sensor electrode 128. Alternatively, the potential of the guard electrode 132 may employ a configuration in which is always same as that of the sensor electrode 128. Note that, in the present embodiment, the guard electrode 132 is provided in a frame shape that completely surrounds the display unit 104 four times, but it is also possible to adopt a configuration in which a part of the frame shape is interrupted.

For example, a period during which an image of the display unit 104 is rewritten (a display period or a refresh period) and a period during which touch detection is performed using the sensor electrode 128 (a touch detection period) are alternately and repeatedly performed using time-division driving in the display device with touch detection function 10.

The function as a control unit of the driver IC 112 will be described. For example, the driver IC 112 inputs a control signal to the first scanning line driver circuit 108A and the second scanning line driver circuit 108B. The first scanning line driver circuit 108A and the second scanning line driver circuit 108B use a control signal to output a scanning signal to the scanning line 118. For example, the data line driving circuit included in the driver IC 112 supplies the control signal and the data signal to the first data signal supply line 134, and inputs the control signal and the data signal to the first multiplexer 107A. Further, the data line driving circuit included in the driver IC 112 supplies the control signal and the data signal to the second data signal supply line 136, and inputs the control signal and the data signal to the second multiplexer 107B. The first multiplexer 107A and the second multiplexer 107B output data signals corresponding to the data (image data) of the image displayed on the display unit 104 to the data line 120 by using the control signals input to each of the first multiplexer 107A and the second multiplexer 107B. In case where the scanning signal and the data signal are inputted from the driver IC 112 to the pixel circuits included in the respective pixels 110 in the display unit, the transistors included in the pixel circuits supply voltages (pixel signals) corresponding to the image data to the pixel electrodes 490 using the scanning signal and the data signal. As a result, each of the plurality of pixels 110 can display a gradation corresponding to the pixel signal, and an image is formed on the entire display unit. At this time, a common voltage is supplied to the plurality of sensor electrodes 128 so that the plurality of sensor electrodes 128 function as common electrodes facing the respective pixel electrodes 490. The common voltage is a pulse wave having a fixed potential or a predetermined period. The common voltage or the predetermined fixed potential is also supplied to the guard electrode 132 in the display period.

In addition, the function of the driver IC 112 as the control unit in the touch detection period will be described. For example, a touch sensor driving circuit included in the driver IC 112 supplies the sensor signal to each sensor wiring 126 via each sensor wiring 126. A portion of the plurality of sensor electrodes 128 form a capacitance with the target object (for example, a user's own finger, a touch pen, or the like), thereby changing the self-capacitance. In case where the touch sensor driving circuit included in the driver IC 112 detects the change in the self-capacitance, the position of the target object on the sensor electrode 128 (on the display unit 104) is detected. At this time, a same signal as the sensor signal supplied to the dummy wiring 124 is supplied to the sensor wiring 126. The sensor signal may be, for example, a pulse wave. In case where the sensor signal is a pulse wave, it is desirable that the phase of the signal supplied to the dummy wiring 124 and the phase of the sensor signal supplied to the sensor wiring 126 are aligned. Alternatively, a configuration in which the signal supplied to the sensor wiring 126 and the signal supplied to the dummy wiring 124 are same may be employed. Note that, in the touch detection period, for example, the plurality of scanning lines 118 are not supplied with the scanning signal, the plurality of data lines 120 are not supplied with the data signal, the plurality of pixels 110 hold the image data of the image displayed on the display unit 104 in a display period before the touch detection period, and the display unit 104 displays the image. The sensor signal supplied to the sensor electrode 128 is also supplied to the guard electrode 132 in the touch detection period.

Each of the scanning line 118, the data line 120, and the wiring to which the sensor signal is supplied may be referred to as a signal line in the present embodiment.

<1-2. Signal in Display Device with Touch Detection Function 10>

Figure 3A:
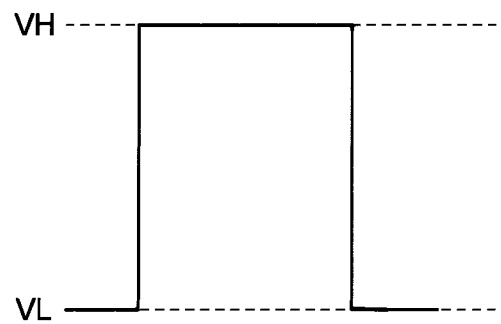
FIG. 3A and FIG. 3B are diagrams for explaining a signal state of a certain data line in a form having a configuration different from that of a display device with touch detection function according to an embodiment of the present invention.
Figure 3A:
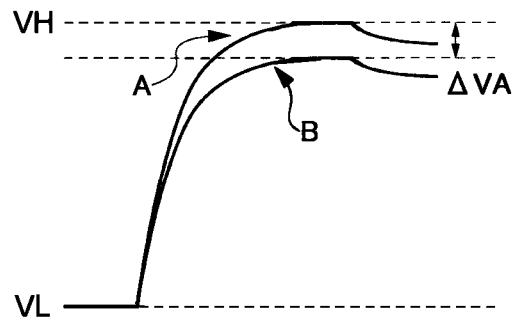
Figure 3B:
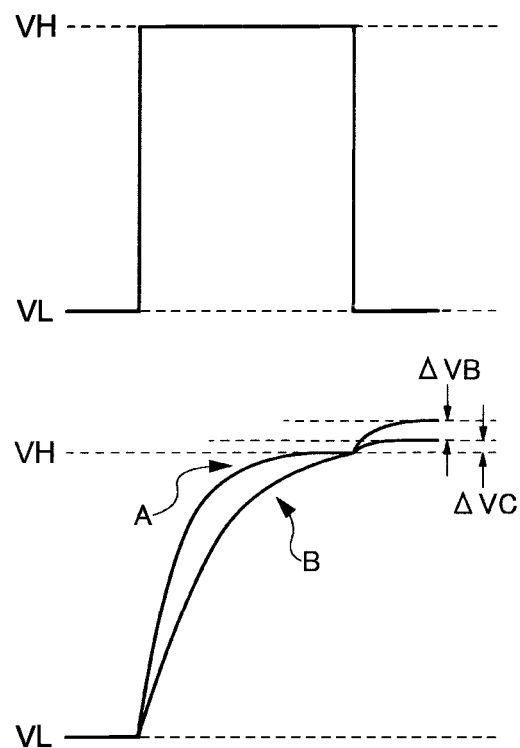

Signals in the display device with touch detection function 10 will be described. FIG. 3A and FIG. 3B are diagrams for explaining a signal state of a certain data line in a form (hereinafter referred to as a comparative example) that does not have a dummy wiring and a configuration associated with a dummy wiring among the display devices with a touch detection function shown in FIG. 1 and FIG. 2, and FIG. 4A and FIG. 4B are diagrams for explaining a signal state of a certain data line in the display device with touch detection function 10 of the present embodiment shown in FIG. 1 and FIG. 2. As described above, since the comparative example is same as the present embodiment except for a configuration associated with a dummy wiring, in case of explaining a comparative example below, same reference numerals will be used for same configurations as the present embodiment and description thereof will be omitted.

The signal in the comparative example will be described. the comparative example does not include the dummy wiring 124 overlapping on the first data signal supply line 134 electrically connected to the first multiplexer 107A is not provided, and includes the sensor wiring 126 overlapping on the second data signal supply line 136 electrically connected to the second multiplexer 107B. Consequently, in case of viewing in a path of the first region 44 from the driver IC 112 to the first multiplexer 107A and a path of the second region 46 from the driver IC 112 to the second multiplexer 107B, capacitive loads differ from each other. More specifically, the capacitive load of the path in the second region 46 is larger than the capacitive load of the path in the first region 44 by an amount corresponding to a provision of the sensor wiring 126.

As shown in FIG. 3A, a signal supplied to a gate electrode 374 (FIG. 7 and FIG. 8) of the transistor 370 in the first multiplexer 107A and the signal supplied to the gate electrode 374 (FIG. 7 and FIG. 8) of the transistor 370 in the second multiplexer 107B are, for example, the same pulsed signal. In case where a pulsed signal is supplied to the gate electrode 374 of the transistor 370 in the first multiplexer 107A, the transistor 370 is turned on, and as shown by curve A in FIG. 3A, the pixel signal supplied to a vicinity of an end A (see FIG. 2) of the data line 120 rises from the voltage VL to the voltage VH and reaches the voltage VH. In case where the transistor 370 is turned off, the signal potential supplied to the vicinity of the end A slightly decreases from the voltage VH.

In contrast, the capacitive load of the path of the second region 46 is greater than the capacitive load of the path of the first region 44. Therefore, as shown by curve B in FIG. 3A, the pixel signal supplied to a vicinity of an end B (see FIG. 2) of the data line 120 extending from the second multiplexer 107B only rises from the voltage VL to a voltage that is lower than the voltage VH by a voltage OVA, and does not reach the voltage VH. In this state, the transistor 370 is turned off, and the signal potential supplied to the vicinity of the end portion B is slightly lowered therefrom.

As described above, the signal potential supplied from the second data signal supply line 136 to the data line 120 via the second multiplexer 107B is lower than the signal potential supplied from the first data signal supply line 134 to the data line 120 via the first multiplexer 107A. This potential difference is directly reflected in a luminance difference of the pixel. Even-numbered data lines 120-2, 120-4, 120-6, . . . connected to the first multiplexer 107A and odd-numbered data lines 120-1, 120-3, 120-5, . . . connected to the second multiplexer 107B are alternately arranged, so that the luminance difference is displayed on the screen as a vertical stripe pattern. That is, the image displayed on the display device with touch detection function according to the comparative example is an image including a defect.

On the other hand, by adjusting wiring resistances and parasitic capacitances of the data lines 120, both the data lines connected to the first multiplexer 107A and the data lines 120 connected to the second multiplexer 107B can be turned VH as shown in FIG. 3B. On the other hand, even in this case, the influence of the difference in the capacitive load of each path cannot be eliminated. More specifically, as shown in FIG. 3B, in case where the multiplexer that supplies the pixel signal to the data line 120 is turned off, the potential of the data line 120 is slightly increased accordingly, but the degree of the potential increase is correlated with the capacitance load of each path, and an amount of increase is reduced by an amount corresponding to the large capacitance load. As a result, in the comparative example, as shown in FIG. 3B, a potential increase amount (curve A in FIG. 3B) of the data line 120 connected to the first multiplexer 107A having a small capacitance load as the path is larger than a potential increase amount (curve B in FIG. 3B) of the data line 120 connected to the second multiplexer 107B, and such a potential difference is also reflected in the luminance difference.

On the other hand, in the display device with touch detection function 10 according to the present embodiment, the dummy wiring 124 overlapping the first data signal supply line 134 which is electrically connected to the first multiplexer 107A is provided, and the sensor wiring 126 overlapping the second data signal supply line 136 which is electrically connected to the second multiplexer 107B is provided. Further, the plurality of dummy wirings 124 and the plurality of sensor wirings 126 are arranged symmetrically with respect to the center line 122 in a plan view, and the same potential are supplied. As a result, the capacitive load of the path of the first region 44 and the capacitive load of the path of the second region 46 become equal.

Figure 4A:
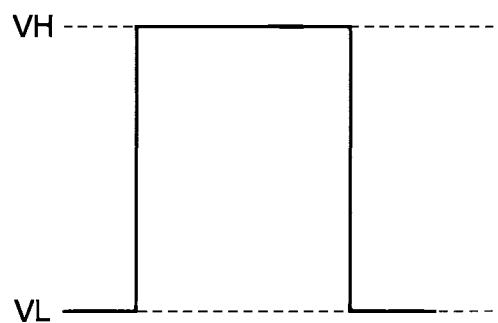
FIG. 4A and FIG. 4B are diagrams for explaining a signal state of a certain data line in a display device with touch detection function according to an embodiment of the present invention.
Figure 4A:
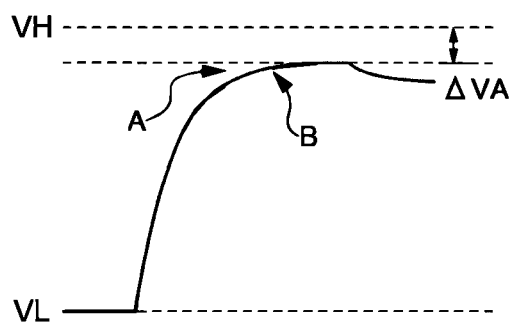
Figure 4B:
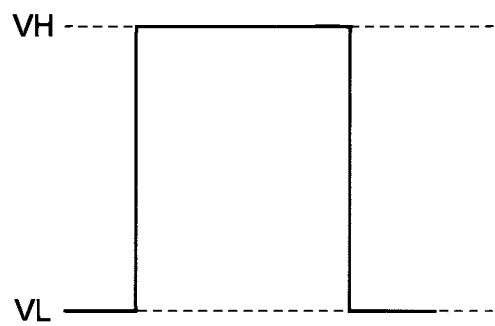
Figure 4B:
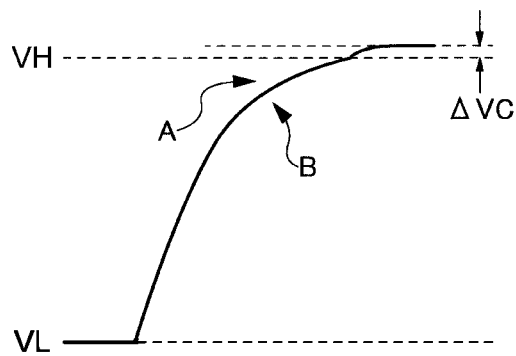

As a result, as shown in FIG. 4A, the arrival potential (curve A) of the data line 120 connected to the data line 120 connected to the first multiplexer 107A and the arrival potential (the curve B) of the data line 120 connected to the second multiplexer 107B become equal to each other, and as shown in FIG. 4B, the increase amount of the signal potential of the data line 120 after the multiplexers are turned off is also equal to each other. Therefore, the luminance of the plurality of pixels 110 electrically connected to the data line 120 electrically connected to the second data signal supply line 136 is equal to or substantially equal to the luminance of the plurality of pixels 110 electrically connected to the data line 120 electrically connected to the first data signal supply line 134. As a result, in the display device with touch detection function 10 according to the present embodiment, the defect of the image displayed on the screen is suppressed.

It should be noted that "the capacitance loads are equal," "the arrival potentials are equal," and "the increase amounts of the signal potentials are equal" include not only the capacitance loads, the arrival potentials, and the increase amounts of the signal potentials are exactly the same, but also extremely slight variations such that the luminance variations cannot be recognized, and errors inevitably occurring in the design and the manufacturing process.

<1-3. Configuration of Display Device with Touch Detection Function 10>

Figure 5:
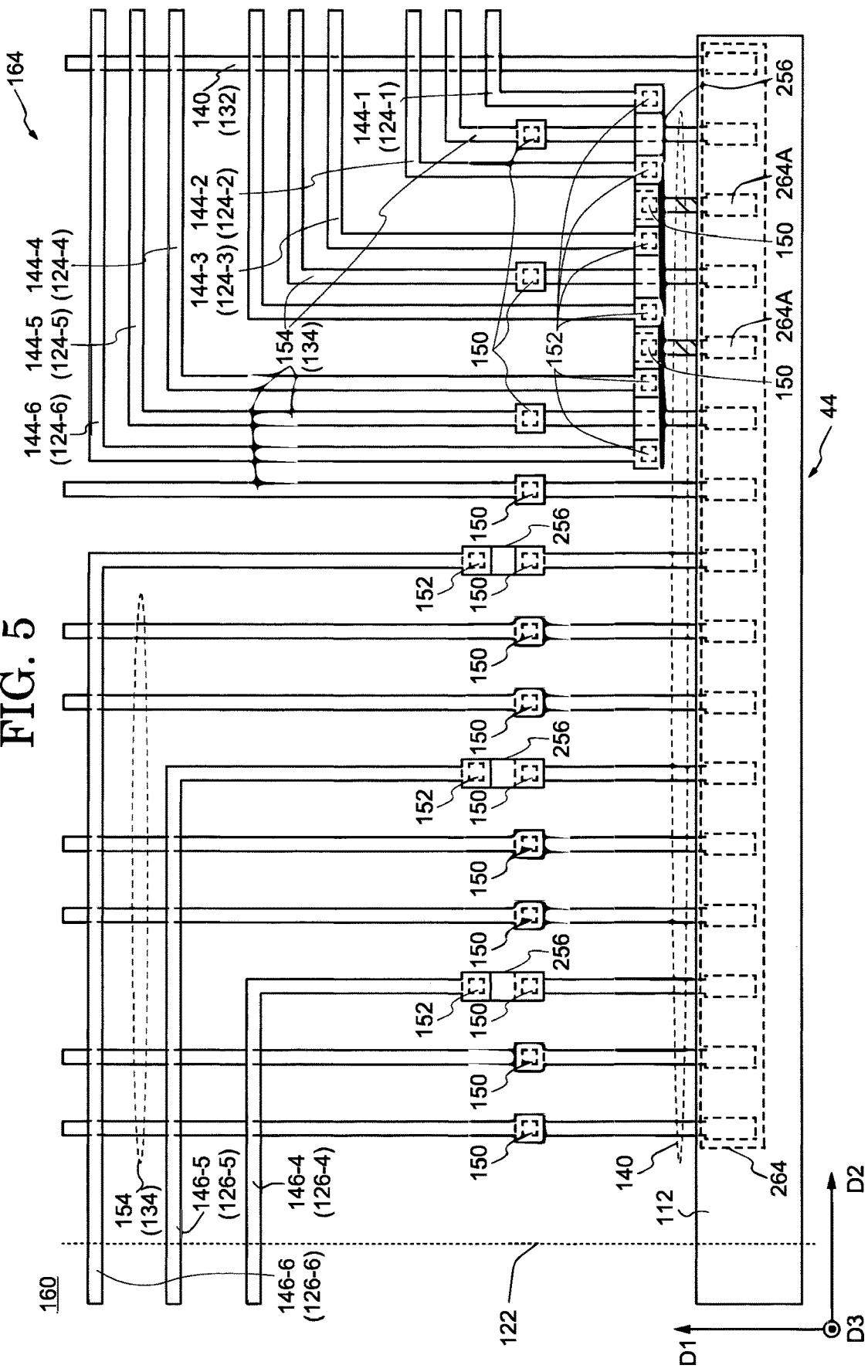
FIG. 5 is a plan view illustrating a configuration of a routing wiring of a display device with touch detection function according to an embodiment of the present invention.
Figure 6:
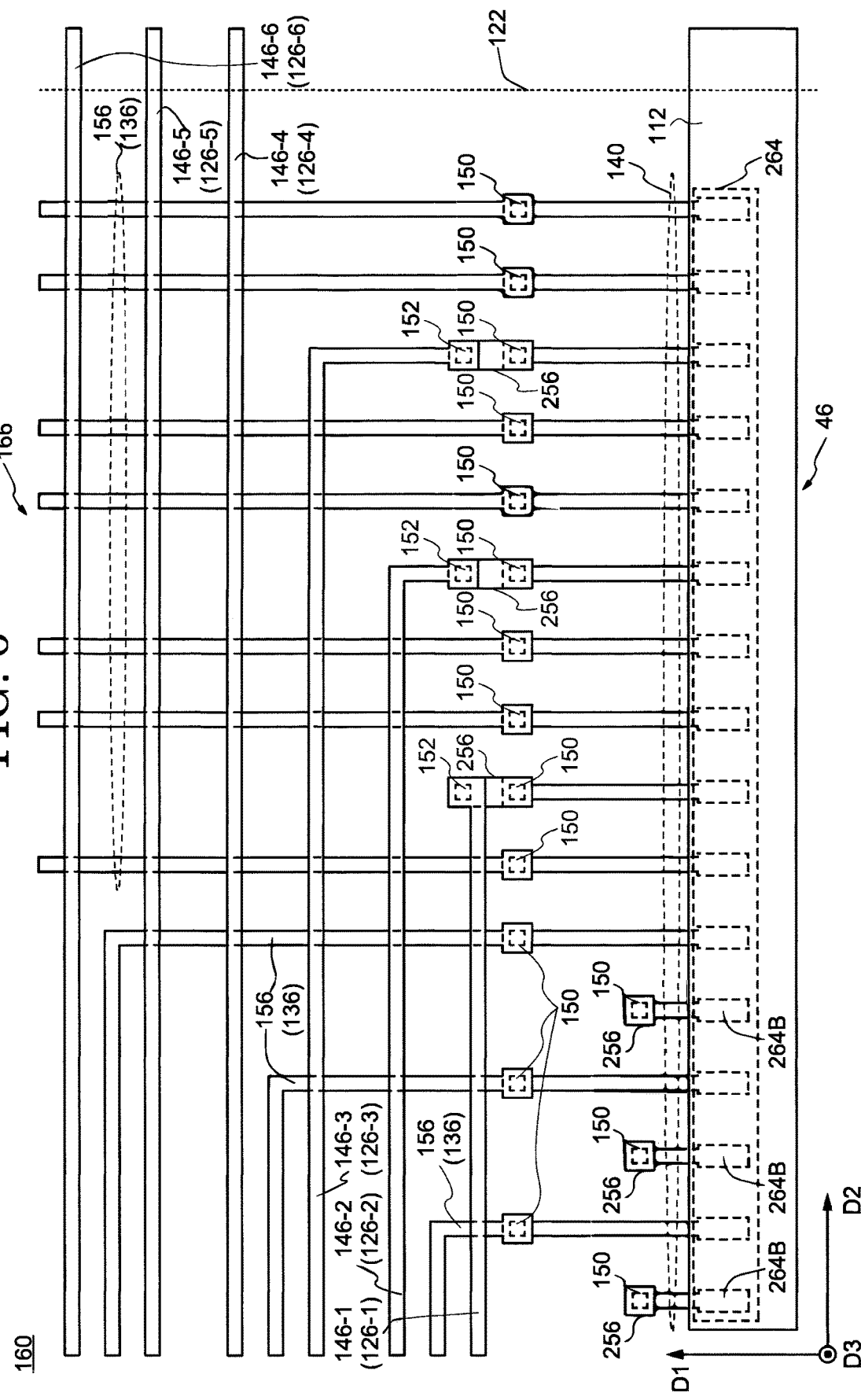
FIG. 6 is a plan view illustrating a configuration of a routing wiring of a display device with touch detection function according to an embodiment of the present invention.
Figure 7:
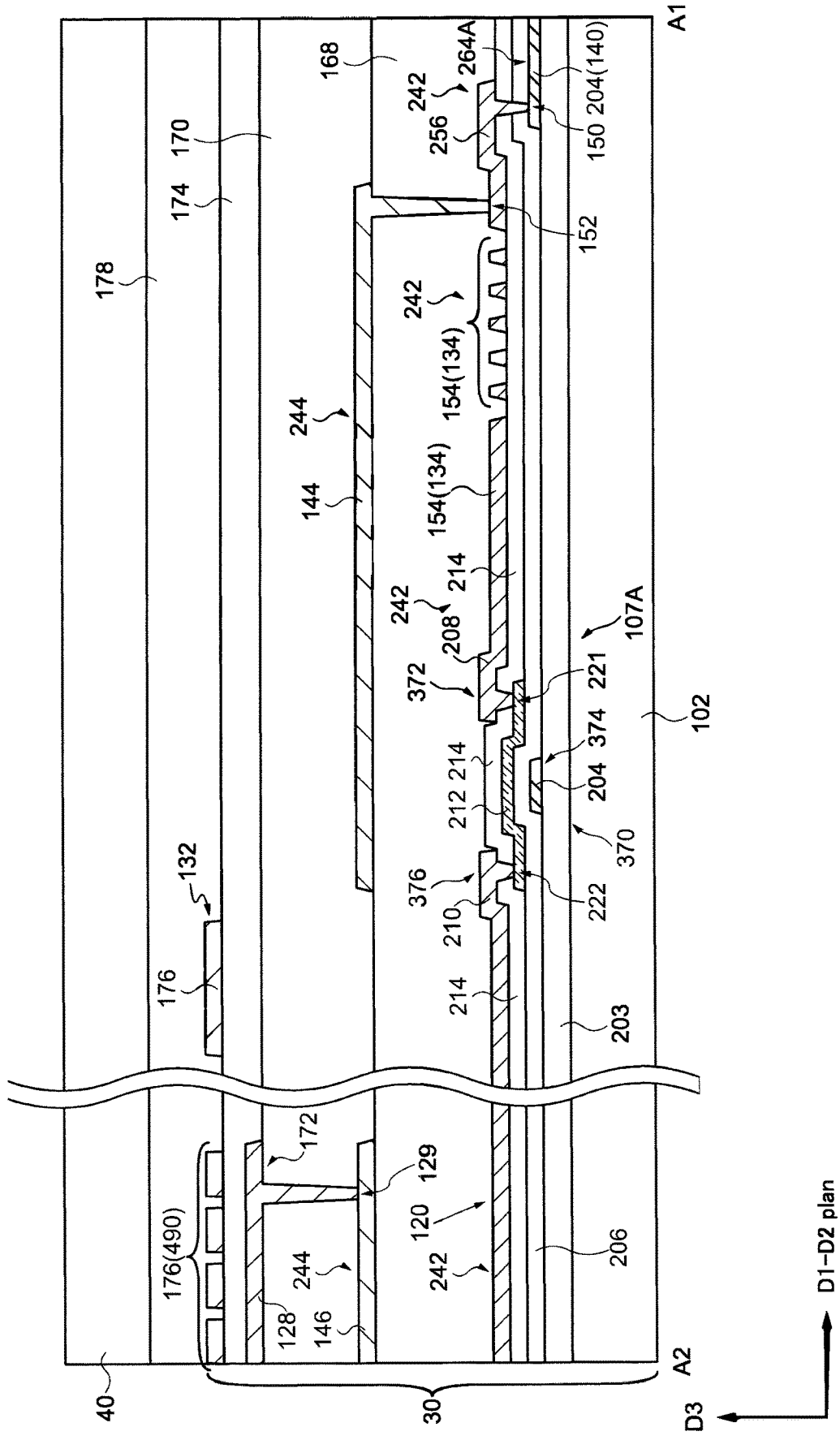
FIG. 7 is an end cross-sectional view illustrating a configuration of a display device with touch detection function according to an embodiment of the present invention.
Figure 8:
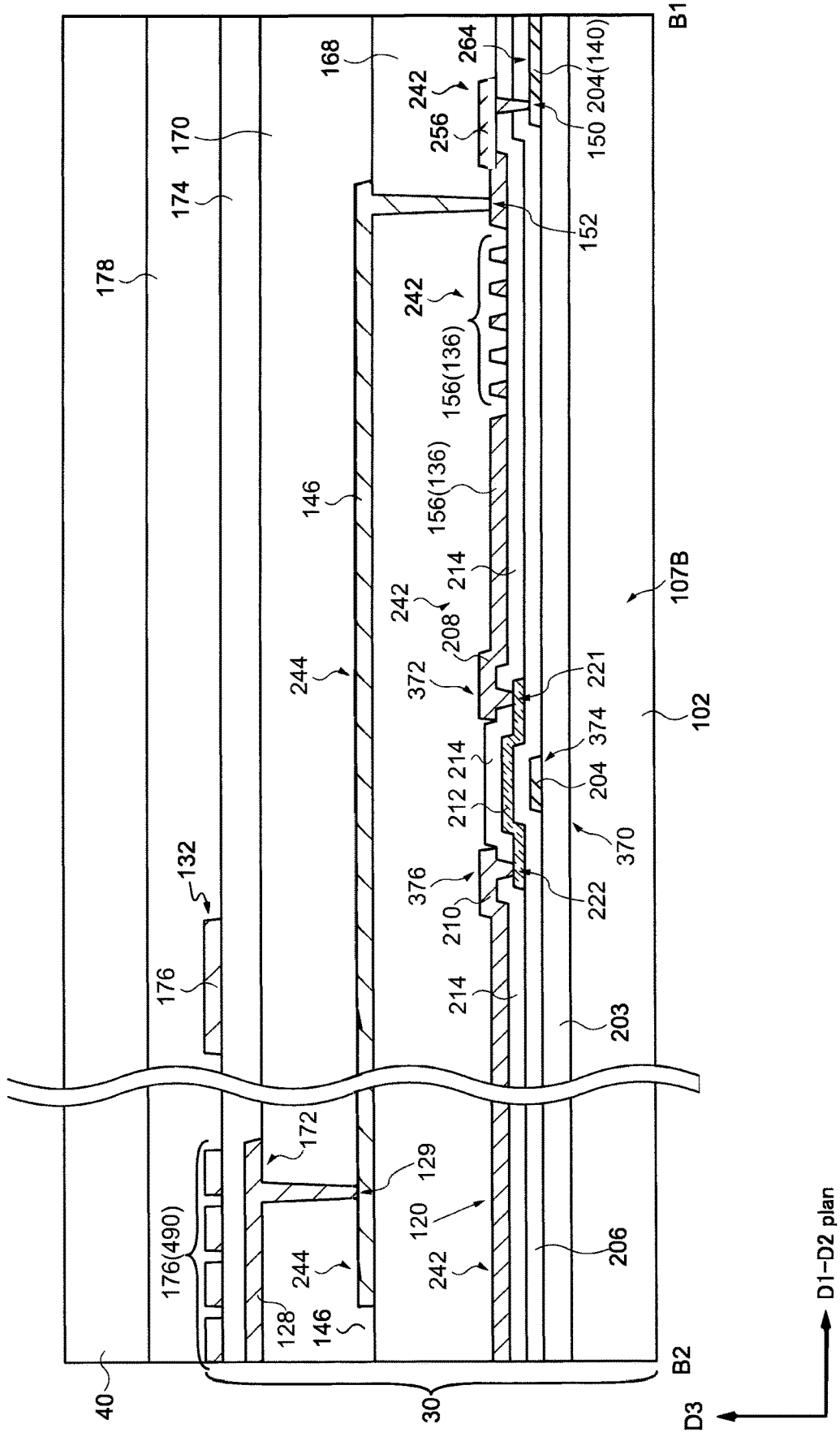
FIG. 8 is an end cross-sectional view illustrating a configuration of a display device with touch detection function according to an embodiment of the present invention.

FIG. 5 and FIG. 6 are plan views illustrating a configuration of a routing wiring of the display device with touch detection function 10. FIG. 7 is a cross-sectional view showing a main part of a cross section taken along a line A1-A2 of the display device with touch detection function 10 shown in FIG. 1, and FIG. 8 is a cross-sectional view showing a main part of a cross section taken along a line B1-B2 of the display device with a touch detection function 10 shown in FIG. 1. The configuration of the display device with touch detection function 10 is not limited to the configuration illustrated in FIG. 5 to FIG. 8. In the configurations illustrated in FIG. 5 to FIG. 8, description of a same or similar configurations as those in FIG. 1 to FIG. 1 or FIG. 2, FIG. 4A and FIG. 4B may be omitted.

FIG. 5 is a diagram illustrating an exemplary layout of a first wiring group 164 in which the third side 102C with respect to the center line 122 is enlarged in a plan view among the terminal peripheral wiring area 160 illustrated in FIG. 1 and FIG. 2. FIG. 6 is a diagram illustrating an exemplary layout of a second wiring group 166 in which the fourth side 102D with respect to the center line 122 is enlarged in a plan view among the terminal peripheral wiring area 160 illustrated in FIG. 1 and FIG. 2.

First, the second wiring group 166 will be described with reference to FIG. 6 or FIG. 8. As shown in FIG. 6, the second wiring group 166 is disposed in the second region 46. The second data signal supply line 136 includes at least a terminal wiring 140 electrically connected to the terminal 264 and a second data signal supply line 156 electrically connected to the terminal line 140 via a contact hole 150. In FIG. 6, the ten second data signal supply lines 136 are electrically connected to the driver IC 112, but the number of the second data signal supply lines 136 may be ten or more.

The sensor wiring 126 includes at least the terminal wiring 140 electrically connected to the terminal 264, a metal wiring 256 disposed in a same layer (a conductive layer 242) as the second data signal supply line 156 electrically connected to the terminal wiring 140 via the contact hole 150, and a sensor wiring 146 electrically connected to the metal wiring 256 via a contact hole 152. For example, the three sensor wirings 126 (126-1 to 126-3 (146-1 to 146-3)) have the above-described configuration and are connected to the terminal 264 in the second region 46, and the remaining sensor wirings 126 (126-4 to 126-6 (146-4 to 146-6)) extend from the second region 46 to the first region 44 (see FIG. 5) in the present embodiment.

Further, as will be described in detail later, referring to FIG. 8 (cross-sectional view), a conductive layer 204 including the terminal 264 and the terminal wiring 140 is disposed on an insulating layer 203 on the first substrate 102. The terminal 264 is electrically connected to the terminal wiring 140. The contact hole 150 penetrates a gate insulating layer 206 and an insulating layer 214. The second data signal supply line 156 (136) and the metal wiring 256 are included in the conductive layer 242 disposed on the insulating layer 214 on the first substrate 102. The contact hole 152 penetrates an insulating layer 168. The sensor wiring 146 (126) is included in a conductive layer 244 disposed on the insulating layer 168.

Each of the three sensor wirings 126-4 to 126-6 out of the six sensor wirings 126-1 to 126-6 is included in the first wiring group 164 shown in FIG. 5, and is electrically connected to the metal wiring 256 using the contact hole 152, and the metal wiring 256 electrically connected to the sensor wirings 126-4 to 126-6 is electrically connected to the terminal wiring 140 using the contact hole 150. In FIG. 6, six sensor wirings 126-1 to 126-6 are electrically connected to the driver IC 112, but the number of the sensor wirings 126 may be seven or more.

The three spare terminals 264B included in the second wiring group 166 are not electrically connected to the sensor wiring lines 126-1 to 126-6 and the second data signal supply line 136.

Next, the first wiring group 164 shown in FIG. 5 will be described. As illustrated in FIG. 5, the first wiring group 164 is disposed in the first region 44. The first data signal supply line 134 includes the terminal line 140 electrically connected to a terminal 264 and a first data signal supply line 154 electrically connected to the terminal line 140 via the contact hole 150. In FIG. 5, the ten first data signal supply lines 134 are electrically connected to the driver IC 112, but the number of the first data signal supply lines 134 may be ten or more.

Further, the sensor wiring 126 (126-4 to 126-6) extending from the second region 46 toward the first region 44 includes at least the terminal wiring 140 electrically connected to the terminal 264, the metal wiring 256 disposed in a same layer (the conductive layer 242) as the second data signal supply line 156 electrically connected to the terminal wiring 140 via the contact hole 150, and the sensor wiring 146 (146-4 to 146-6) electrically connected to the metal wiring 256 via the contact hole 152.

In addition, the first region 44 is provided with a configuration in which the dummy wiring 124 and a dummy wiring 144 are connected to the terminal 264. More specifically, each dummy wiring 124 includes at least the terminal wiring 140 electrically connected to the terminal 264, a metal wiring 256 electrically connected to the terminal wiring 140 via the contact hole 150, and the dummy wiring 144 electrically connected to the metal wiring 256 via the contact hole 152. For example, the dummy wiring 124 is arranged by using the spare terminal 264A arranged at a position symmetrical or substantially symmetrical with the spare terminal 264B included in the second wiring group 166 among a plurality of terminals 264 in the present embodiment. Specifically, each of a plurality of (six in the present embodiment) dummy wirings 124-1 to 124-6 (144-1 to 144-6) is electrically connected to the strip-shaped metal wiring 256 using the contact hole 152, and the metal wiring 256 is electrically connected to the two spare terminals 264A using the two contact holes 150.

As will be described later, referring to FIG. 7 (cross-sectional view), the spare terminal 264A is included in the conductive layer 204 and is disposed on the insulating layer 203 on the first board 102. The spare terminal 264A is electrically connected to the terminal wiring 140. The first data signal supply line 154 (134) is included in the conductive layer 242 disposed on the insulating layer 214 on the first substrate 102, similar to the second data signal supply line 156 (136) and the metal wiring 256. The dummy wiring 124 (144) is included in the conductive layer 244 disposed on the insulating layer 168, similarly to the sensor wiring 146 (126).

The guard electrode 132 is disposed using the terminal wiring 140. Further, although described in the second wiring group 166 shown in FIG. 6, three sensor wirings 126-4 to 126-6 of the six sensor wirings 126-1 to 126-6 are included in the first wiring group 164.

Referring to the drawings of both FIG. 5 and FIG. 6, the wiring included in the first wiring group 164 is arranged symmetrically with the wiring included in the second wiring group 166. Specifically, the ten first data signal supply lines 134 are arranged symmetrically with the ten second data signal supply lines 136, and some of the six dummy wirings 124-1 to 124-6 are arranged substantially symmetrically with some of the six sensor wirings 126-1 to 126-6. The metal wirings 256 electrically connected to the six dummy wirings 124-1 to 124-6 are electrically connected to the two spare terminals 264A at positions as close as possible to the driver IC 112. The number (six) of the contact holes 152 with the metal wirings 256 electrically connected to the six dummy wirings 124-1 to 124-6 is same as the number (six) of the contact holes 152 with the metal wirings 256 electrically connected to the six sensor wirings 126-1 to 126-6.

In the display device with touch detection function 10, the dummy wiring 124 and the sensor wiring 126 are symmetrically arranged with respect to the center line 122 as an axis of symmetry. More specifically, the dummy wiring 124 and the sensor wiring 126 have a same length, bending position, and number of the dummy wiring 124 and the sensor wiring 126 corresponding to each other at least in an area extending from the terminal peripheral wiring area 160 to the multiplexer 107A, 107B. In addition, the number of the contact holes 152 in the terminal peripheral wiring area 160 is the same for each of the dummy wiring 124 and the sensor wiring 126. With such a configuration of the dummy wiring 124 and the sensor wiring 126, a total impedance of the dummy wiring 124 and the sensor wiring 126 can be made substantially equal so as to be able to suppress an image defect such as the above-described vertical stripe pattern or vertical streak. As a result, in the display device with a touch detection function 10, the loads of the plurality of data lines 120 are substantially the same. Therefore, by using the display device with touch detection function 10 according to the present embodiment, a defect in an image displayed on a screen is suppressed.

In the present embodiment, three sensor wirings 126-1 to 126-3 out of the six sensor wirings 126-1 to 126-6 are included in the first wiring group 164, but all of the six sensor wirings 126-1 to 126-6 may be included in the second wiring group 166. By including all of the six sensor wirings 126-1 to 126-6 in the second wiring group 166, it is possible to accurately align the total impedance of the dummy wiring 124 and the sensor wiring 126.

Next, a configuration of a cross section of the display device with touch detection function 10 will be described in detail with reference to FIG. 7 and FIG. 8.

The transistor 370 is a sampling switch included in the first multiplexer 107A or the second multiplexer 107B. The transistor 370 is a bottom-gate transistor including a semiconductor layer 212. A transistor having a same configuration as that of the transistor 370 described here may be used, for example, for the first multiplexer 107A, the second multiplexer 107B, the first scanning line driving circuit 108A, and the second scanning line driving circuit 108B.

As shown in FIG. 7, the insulating layer 203 is disposed as an underlayer on the first substrate 102. The insulating layer 203 may be a plurality of stacked insulating layers. The conductive layer 204 is disposed on the insulating layer 203. The conductive layer 204 includes the gate electrode 374 and the terminal wiring 140 of the transistor 370.

A gate insulating layer 206 is provided on a portion of an upper surface of the insulating layer 203, the gate electrode 374, and the terminal wiring 140 so as to be in contact with an upper surface and a side surface of the gate electrode 374, and a portion and a side surface of an upper surface of the terminal wiring 140. The semiconductor layer 212 is provided on an upper surface of the gate insulating layer 206. The gate electrode 374 faces the semiconductor layer 212. The insulating layer 214 is disposed so as to be in contact with a part of an upper surface of the gate insulating layer 206 and an upper surface and a side surface of the semiconductor layer 212. Contact holes 222 and 221 are formed in the insulating layer 214, and the contact hole 150 penetrating through the insulating layer 214 and the gate insulating layer 206 is formed. The conductive layer 242 is disposed on the insulating layer 214. The conductive layer 242 includes the data line 120, a first terminal 208 functioning as a source electrode 372 of the transistor 370, a second terminal 210 functioning as a drain electrode 376 of the transistor 370, the first data signal supply line 154 (134) electrically connected to the first terminal 208, the first data signal supply line 154 (134) extending in D1-D2 plan, and a metal wiring 256 electrically connected to the terminal wiring 140 via the contact hole 150. The first terminal 208 is electrically connected to one end of a pattern of the semiconductor layer 212 through the contact hole 221, and the second terminal 210 is electrically connected to the other end of the pattern of the semiconductor layer 212 through the contact hole 222.

The insulating layer 168 is disposed in contact with an upper surface and a side surface of the data line 120, an upper surface and a side surface of the first terminal 208, an upper surface and a side surface of the second terminal 210, an upper surface and a side surface of the first data signal supply line 154 (134), an upper surface and a side surface of the metal wiring 256, and the insulating layer 214. The contact hole 152 is formed in the insulating layer 168.

The conductive layer 244 is disposed on an upper surface of the insulating layer 168. The conductive layer 244 includes the dummy wiring 144 and the sensor wiring 146. The dummy wiring 144 is electrically connected to the metal wiring 256 via the contact hole 152. The dummy wiring 144 overlaps at least a portion of the first data signal supply line 154 via the insulating layer 168. An insulating layer 170 is disposed so as to be in contact with the upper surface of the insulating layer 168, an upper surface and a side surface of the sensor wiring 146, and an upper surface and a side surface of the dummy wiring 144. The contact hole 129 is formed in the insulating layer 170.

A conductive layer 172 is disposed on an upper surface of the insulating layer 170. The conductive layer 172 includes the sensor electrode 128. The sensor electrode 128 is electrically connected to the sensor wiring 146 via the contact hole 129. An insulating layer 174 is disposed so as to be in contact with the upper surface of the insulating layer 170, an upper surface and a side surface of the sensor electrode 128.

A conductive layer 176 is disposed on an upper surface of the insulating layer 174. The conductive layer 176 includes the guard electrode 132 and the plurality of pixel electrodes 490. Although not shown, the guard electrode 132 is electrically connected to the conductive layer 176 by using, for example, the terminal wiring 140, the contact hole 150, the first data signal supply line 154, the contact hole 152, the dummy wiring 144, and the contact holes electrically connected to the dummy wiring 144. Further, although not shown, the plurality of pixel electrodes 490 are electrically connected to the drain electrodes of the transistors of the pixel circuits included in the pixel 110. The transistor of the pixel circuit has a same configuration as that of the transistor 370. In the display device with touch detection function 10, an example is shown in which the dummy wiring 144 is not overlapped with the guard electrode 132, but the dummy wiring 144 may be overlapped with the guard electrode 132.

For example, a part including the first substrate 102 to the conductive layer 176 stacked in the third axial D3 is referred to as an arrayed substrate 30, and a second substrate 40 is referred to as a counter substrate in the present embodiment.

For example, the insulating layer 174 of the array substrate 30 and the second substrate 40 are bonded to each other in a seal unit (not shown) so as to face each other in the display device with touch detection function 10. A color filter layer may be disposed on a surface of the second substrate 40 opposite the array substrate 30. The liquid crystal layer 178 including the liquid crystal element is injected between the insulating layer 174 of the array substrate 30 and the second substrate 40.

The insulating layer 203, the gate insulating layer 206, the insulating layer 214, and the insulating layer 174 are formed using, for example, an inorganic insulating film in the display device with touch detection function 10. The insulating layer 168 and the insulating layer 170 are formed using, for example, an organic insulating film. The inorganic insulating film is a thin film as compared with the organic insulating film, and the organic insulating film is a thick film as compared with the inorganic insulating film. The organic insulating film can be formed thickly, and functions as a planarization film that relaxes an unevenness of a lower layer of the organic insulating film.

The first data signal supply line 154 (134) in the end cross-sectional view shown in FIG. 7 is replaced with the second data signal supply line 156 (136), and the dummy wiring 144 is not arranged in the end cross-sectional view shown in FIG. 8. In the end cross-sectional view shown in FIG. 8, a description thereof is omitted since it is otherwise similar to the end cross-sectional view shown in FIG. 7 in the end cross-sectional view shown in FIG. 8.

As shown in FIG. 8, a conductive layer 244 is disposed on the upper surface of the insulating layer 168. The conductive layer 244 includes the sensor wiring 146. The sensor wiring 146 is electrically connected to the metal wiring 256 via the contact hole 152. The sensor wiring 146 is overlapped with at least a portion of the second data signal supply line 156 via the insulating layer 168. The insulating layer 170 is disposed so as to be in contact with the upper surface of the insulating layer 168, and the upper surface and the side surface of the sensor wiring 146. The contact hole 129 is formed in the insulating layer 170. The sensor wiring 146 is electrically connected to the sensor electrode 128 via the contact hole 129.

Second Embodiment

A configuration of the display device with touch detection function 10 different from the first embodiment will be described in the second embodiment. An auxiliary wiring 124C is disposed on the plurality of sensor electrodes 128 overlapping on the display unit 104 in the display device with touch detection function 10 according to the second embodiment. Other points are same as those of the display device with touch detection function 10 according to the first embodiment, and thus a description thereof will be omitted.

Figure 9:
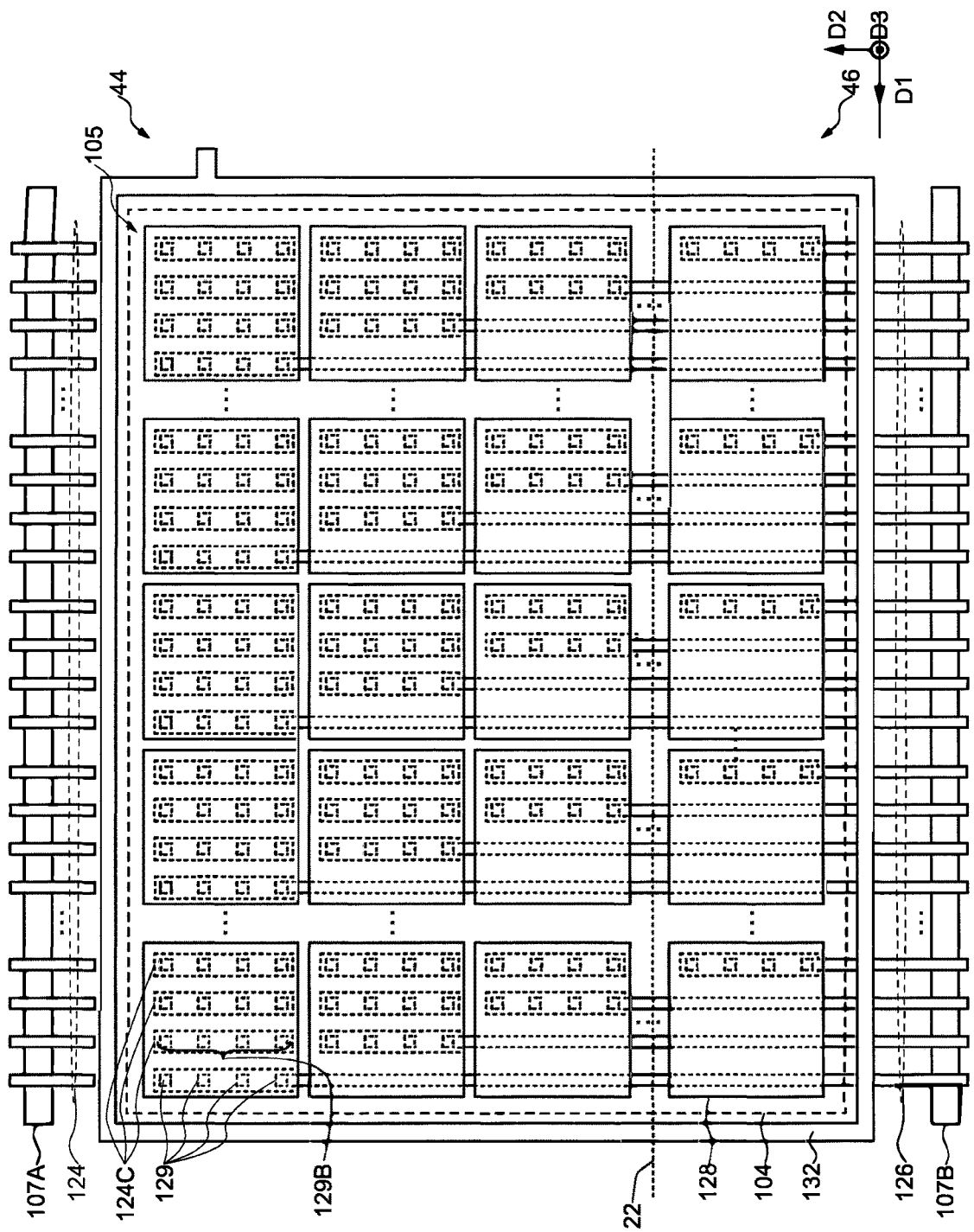
FIG. 9 is a plan view illustrating a configuration of a display device with touch detection function according to a second embodiment of the present invention.

FIG. 9 is a plan view showing the configuration of the display device with touch detection function 10 according to the second embodiment of the present invention. Configurations other than the display unit 104 and a periphery thereof are omitted in FIG. 9.

As shown in FIG. 9, four sensor wirings 126 are arranged along the second axial D2, and the four sensor electrodes 128 are electrically connected to the four sensor wirings 126 in a one-to-one manner.

Among the four sensor electrodes 128, in the sensor electrode 128 closest to the first multiplexer 107A, the sensor wiring 126 is electrically connected via the four contact holes 129, and each of the three auxiliary wiring 124C is electrically connected via the four contact holes 129. Each of the three sub-wiring 124C is disposed on an extension line of the dummy wiring 124 parallel to the second axial D2 and not connected to the dummy wiring 124.

Next, in the sensor electrode 128 close to the first multiplexer 107A, the sensor wiring 126 is electrically connected via the four contact holes 129, and each of the two auxiliary wiring 124C is electrically connected via the four contact holes 129.

As the first multiplexer 107A approaches the second multiplexer 107B (FIG. 2), a number of sensor wirings 126 overlapping on the sensor electrodes 128 increases, and a number of electrically connected auxiliary wirings 124C decreases. The sensor electrode 128 closest to the second multiplexer 107B has four sensor wirings 126 overlapping thereon, and is electrically connected to one of the sensor wirings 126 via four contact holes 129, and the auxiliary wiring 124C is not disposed.

As shown in FIG. 9, the auxiliary wiring 124C and the opposing sensor wiring 126 are disposed on the extension line of the dummy wiring 124. A number of dummy wirings 124, a number of auxiliary wirings 124C, a number of sensor electrodes 128, and a number of contact holes 129 in FIG. 9 are exemplary, and are not limited to the configuration shown in FIG. 9.

One or a plurality of auxiliary wiring 124C are provided between the sensor wiring 126 and the dummy wiring 124 provided to face the sensor wiring, and the auxiliary wiring 124C are connected to the sensor electrodes 128 in the display device with touch detection function 10 according to the second embodiment. As a result, in addition to the parasitic capacitance added to each data line 120 depending on the outside of the display unit 104, the parasitic capacitance added to each data line 120 depending on the inside of the display unit 104 is added, and the total impedance of the dummy wiring 124 and the sensor wiring 126 is smoothed.

As an embodiment of the present invention, the above-described embodiments of the display device with touch detection function 10 can be appropriately combined and implemented as long as there is no mutual inconsistency. Further, within the scope of the idea of the present invention, a person skilled in the art can correspond to various modifications and examples, and it is understood that these modifications and examples also fall within the scope of the present invention. For example, in the present embodiment, a configuration in which the odd-numbered data line 120 extends from the second multiplexer 107B and the even-numbered data line 120 extends from the first multiplexer 107A is employed, but a configuration in which the data lines 120 extend from both the multiplexers 107A and 107B at all times, while the data lines 120 extend only to a central part of the display unit and face each other can also be employed. Further, an example in which the liquid crystal element is used for the display unit 104 is shown in the display device with touch detection function 10 according to the present embodiment, but the display device with touch detection function 10 may use a EL element which is a light emitting element for the display unit 104. Here, the sensor electrode 128 does not have a function as the common electrode in the above-described display period, and the sensor electrode 128, the sensor wiring, and the like are provided on the EL device, and the sensor wiring and the dummy wiring face the data signal supply line through the insulating layer in the peripheral unit.

In addition, as long as the present invention is provided with the gist of the present invention, the person skilled in the art appropriately adds, deletes, or changes in design of the constituent elements or adds, omits, or changes in conditions of processes to the above-described embodiments are also included in the scope of the present invention.

In addition, other effects provided by aspects in one embodiment of the present invention will be apparent from the description of the present specification, or those that can be appropriately conceived by the person skilled in the art will be understood to be naturally provided by the present invention.

What is claimed is:

1. A display device with touch sensor comprising:
a substrate;
a display region above the substrate;
a peripheral region above the substrate and outside the display region;
a first data line and a second data line located in the display region and the peripheral region;
terminals along a side of the substrate;
a flexible substrate connected to the terminals;
a first region and a second region in the peripheral region, the display region and the terminals being between the first region and the second region;
a sensor electrode in the display region;
a first data signal supply line electrically connected to the first data line and arranged in the first region;
a dummy wiring arranged in the first region, overlapping a part of the first data signal supply line, and not connected to the sensor electrode;
a second data signal supply line electrically connected to the second data line and arranged in the second region; and
a sensor wiring arranged in the second region, overlapping a part of the second data signal supply line, and connected to the sensor electrode,
wherein the dummy wiring and the sensor wiring are arranged to have a symmetrical wiring path or a substantially symmetrical wiring path.

2. The display device according to claim 1, wherein the dummy wiring and the sensor wiring are symmetrical or substantially symmetrical with respect to a line orthogonal to a center of the side of the substrate.

3. The display device according to claim 1, wherein a line length of the dummy wiring is substantially same as a line length of the sensor wiring.

4. The display device according to claim 1, wherein the first and second data signal supply lines, the dummy wiring, and the sensor wiring are bent and have a first portion extending along the side of the substrate and a second portion extending along a direction intersecting the side of the substrate.

5. The display device according to claim 1, wherein the dummy wiring and the sensor electrode are configured to be supplied with a same signal.

6. The display device according to claim 1, wherein the dummy wiring is configured to be supplied with a signal with a same phase as a phase of a sensor signal configured to input to the sensor electrode.

7. The display device according to claim 1, further comprising an auxiliary wiring electrically connected to the sensor electrode,
wherein the dummy wiring with a third portion extends toward the display region, and
the auxiliary wiring, the third portion and the sensor wiring extend in a same direction and align in a line in the same direction.

8. A display device with a touch sensor comprising:
a substrate;
a display region above the substrate;
a peripheral region above the substrate and outside the display region;
a first data line and a second data line located in the display region and the peripheral region;
terminals along a side of the substrate;
a flexible substrate connected to the terminals;
a first region and a second region in the peripheral region, the display region and the terminals being between the first region and the second region;
a sensor electrode in the display region;
a first data signal supply line electrically connected to the first data line and arranged in the first region;
a dummy wiring arranged in the first region, and not connected to the sensor electrode;
a second data signal supply line electrically connected to the second data line and arranged in the second region; and
a sensor wiring arranged in the second region, and connected to the sensor electrode,
wherein a line length of the dummy wiring is substantially same as a line length of the sensor wiring.

9. The display device according to claim 8, wherein the dummy wiring and the sensor wiring are symmetrical or substantially symmetrical with respect to a line orthogonal to a center of the side of the substrate.

10. The display device according to claim 8, wherein the first and second data signal supply lines, the dummy wiring, and the sensor wiring are bent and have a first portion extending along the side of the substrate and a second portion extending along a direction intersecting the side of the substrate.

11. The display device according to claim 8, wherein the dummy wiring and the sensor electrode are configured to be supplied with a same signal.

12. The display device according to claim 8, wherein the dummy wiring is configured to be supplied with a signal with a same phase as a phase of a sensor signal configured to input to the sensor electrode.

13. The display device according to claim 8, further comprising an auxiliary wiring electrically connected to the sensor electrode,
wherein the dummy wiring with a third portion extends toward the display region, and
the auxiliary wiring, the third portion and the sensor wiring extend in a same direction and align in a line in the same direction.

14. A display device with a touch sensor comprising:
a substrate;
a display region above the substrate;
a peripheral region above the substrate and outside the display region;
a first data line and a second data line located in the display region and the peripheral region;
terminals along a side of the substrate;
a flexible substrate connected to the terminals;

a first region and a second region in the peripheral region, the display region and the terminals being between the first region and the second region;

a sensor electrode in the display region;

a first data signal supply line electrically connected to the first data line and arranged in the first region;

a dummy wiring arranged in the first region, overlapping a part of the first data signal supply line, and not connected to the sensor electrode;

a second data signal supply line electrically connected to the second data line and arranged in the second region;

a sensor wiring arranged in the second region, overlapping a part of the second data signal supply line, and connected to the sensor electrode; and an auxiliary wiring electrically connected to the sensor electrode;

wherein the dummy wiring has a line portion extending toward the display region, and the auxiliary wiring, the line portion and the sensor wiring extend in a same direction and align in a line in the same direction.

15. The display device according to claim 14, wherein the dummy wiring and the sensor wiring are symmetrical or substantially symmetrical with respect to a line orthogonal to a center of the side of the substrate.

16. The display device according to claim 14, wherein the first and second data signal supply lines, the dummy wiring, and the sensor wiring are bent and have a first portion extending along the side of the substrate and a second portion extending along a direction intersecting the side of the substrate.

17. The display device according to claim 14, wherein the dummy wiring and the sensor electrode are configured to be supplied with a same signal.

18. The display device according to claim 14, wherein the dummy wiring is configured to be supplied with a signal with a same phase as a phase of a sensor signal configured to input to the sensor electrode.

* * * * *